United States Patent [19]

Lewis

[11] 4,207,536
[45] Jun. 10, 1980

[54] DUAL-ADJUSTMENT BALANCE CIRCUIT FOR OPERATIONAL AMPLIFIERS

[75] Inventor: Paul H. Lewis, Houghton, Mich.

[73] Assignee: Michigan Technological University, Houghton, Mich.

[21] Appl. No.: 882,781

[22] Filed: Mar. 2, 1978

[51] Int. Cl.² .............................................. H03F 3/45
[52] U.S. Cl. ...................................... 330/69; 330/261
[58] Field of Search ..................... 330/9, 69, 108, 149, 330/261, 295, 296, 109

[56] References Cited

U.S. PATENT DOCUMENTS

| | | | |
|---|---|---|---|
| 3,304,513 | 2/1967 | Offner | 330/295 X |
| 3,696,304 | 10/1972 | Fricke, Jr. | 330/69 X |
| 4,023,046 | 5/1977 | Renirie | 330/69 X |
| 4,037,170 | 7/1977 | Richards | 330/108 X |

Primary Examiner—James B. Mullins
Attorney, Agent, or Firm—Michael, Best & Friedrich

[57] ABSTRACT

A method and circuit for balancing the offset voltage of an operational amplifier having an input resistor connected to an inverting input, and a feedback resistor connected to and between the inverting input and the amplifier output. The circuit is made up of an adjustable voltage divider network connected to the positive and negative power supplies of the amplifier and includes coarse and fine potentiometers for applying a first adjustable voltage to the inverting input to set the inverting voltage to zero, and a third potentiometer for applying a second adjustable voltage to the non-inverting input to set the amplifier output voltage to zero. The resulting offset voltage balance is generally insensitive to changes in values of the input resistor and the feedback resistor.

16 Claims, 3 Drawing Figures

DUAL-ADJUSTMENT BALANCE CIRCUIT FOR OPERATIONAL AMPLIFIERS

BACKGROUND OF THE INVENTION

The invention relates generally to operational amplifier circuits, and more particularly, to balancing circuits used in connection with inverting operational amplifiers for compensating or balancing offset voltages exhibited by the amplifier.

Virtually all operational amplifiers have an inherent offset voltage so that, without an offset voltage balance circuit, the amplifier output voltage is non-zero when the input signal voltage is zero. Thus, an offset balance circuit is required so that an operational amplifier provides a linear amplification of the input voltage signal.

Heretofore, an offset voltage balance has been provided by connecting a balance circuit to apply an adjustable voltage to the non-inverting input of the inverting operational amplifier. Such balance circuits are well known and operate to provide a null or balance so that the amplifier output voltage is zero when the signal voltage to be amplified is zero. Further background and examples of prior balance circuits are contained on pages 114-147 of a book entitle THE VERSATITLE OP AMP written by Michael Kahn, published in 1970 by Holt, Reinhart and Winston, Inc., and assigned Library of Congress Catalog Card Number 77-107333.

Another balancing arrangement provides connecting points from the operational amplifier circuit. The user may attach potentiometers to these connecting points, which are not directly connected to the amplifier inputs, and adjsts the potentiometers to null or balance the offset voltage. A typical operational amplifier having such an offset voltage null capability is designated "micro A741" and is manufactured by Analog Devices Inc., located in Norwood, Mass.

Another balance circuit arrangement for an operational amplifier utilized as a differential amplifier, and connected in circuit to operate as a three-wire transducer, is disclosed in Raymond, U.S. Pat. No. 3,602,832, issued Aug. 31, 1971.

It is well known that in order to provide an inverting operational amplifier circuit having a stable gain, such a circuit should include an input resistor and feedback means such as a feedback resistor. In prior balance circuit arrangements, a change in the resistance value of the input resistor or the feedback resistor has upset the offset voltage balance. This upset in offset voltage has, in many applications, prevented or discouraged the use of relatively inexpensive operational amplifiers, because such amplifiers generally require significantly large input bias currents, and hence, require a new offset voltage balance with every significant change in the resistance values of the input and feedback resistors. More specifically, relatively inexpensive inverting operational amplifiers made up of, for example, a bipolar transistor amplifiers, which require significantly large input bias currents, have heretofore not been able to be effectively utilized in critical applications such as analog computation and various instrumentation circuits for which the input or feedback resistors are frequently changed.

This invention is concerned with the general area and has among its objects to provide a balance circuit which eliminates offset voltage balance problems exhibited by the prior art. More specifically, the invention has among its objects to provide a method and a dual-adjustment balance circuit for operational amplifiers which can be adjusted to achieve a stable offset voltage balance which is generally insensitive to changes in the input and feedback resistors so that relatively inexpensive operational amplifiers can be effectively utilized in critical applications such as analog computation.

SUMMARY OF THE INVENTION

The invention provides a method and a circuit for inverting operational amplifiers which provides an offset voltage balance which is generally insensitive to changes in the resistance values of input and feedback resistors connected to the amplifier. The invention also provides an amplifier circuit suitable for use in analogue computation, and which incorporates an operational amplifier and the balance circuit to be further described. According to the method and balance circuit of the present invention, a first adjustable voltage is applied to the inverting input for setting the inverting input voltage to zero, and a second adjustable voltage is applied to the non-inverting input for setting the amplifier output voltage to zero, thereby achieving a stable offset voltage balance.

According to a preferred embodiment of the invention, the balance circuit is made up of an adjustable voltage divider network connected to the positive and negative power supplies of the operational amplifier. The network includes coarse and fine potentiometers which are connected in circuit to supply a voltage to both inputs of the operational amplifier, and which are adjusted so that the voltage applied to the inverting input sets the inverting input voltage to zero. The network includes another potentiometer which controls the relative voltage of the amplifier inputs, and which is adjusted until the amplifier output voltage is zero to provide the stable offset voltage balance. The resistance values of the potentiometers and the resistors which make up the balance circuit are preferably chosen to have generally specified relative values. One of the substantial benefits of using the method and balance circuit of the present invention is that relatively inexpensive operational amplifiers can be effectively utilized in critical applications such as in analog computation.

DESCRIPTION OF THE PREFERRED EMBODIMENT

Figure 1:
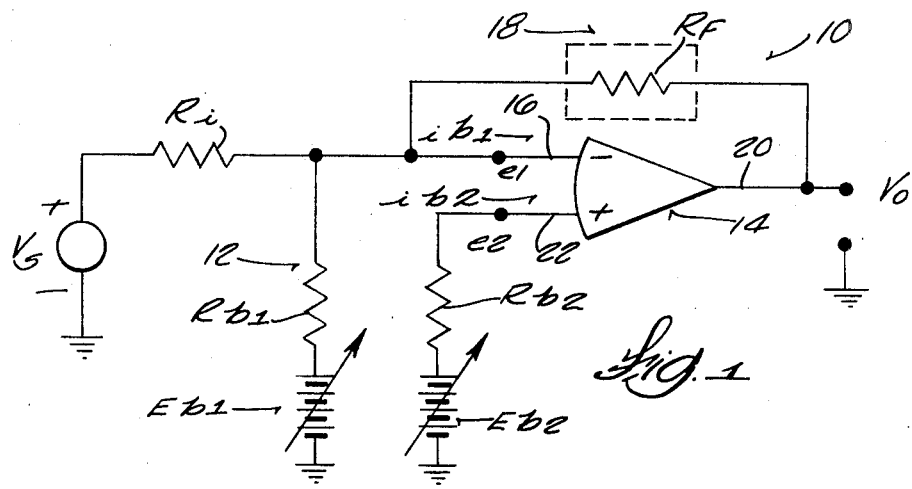
FIG. 1 is a schematic diagram of an amplifier circuit which embodies various features of the invention.

Shown in FIG. 1 is an amplifier circuit 10 suitable for use in analog computation or an analog computer (not shown) and which includes a dual-adjustment balance circuit 12 connected to a conventional inverting operational amplifier 14. An interchangeable or plug-in input resistor $R_i$ (diagrammatically shown) is connected to the inverting input 16 of the amplifier 14, and feedback means, generally designated 18, which preferable comprises an interchangable or plug-in feedback resistor $R_f$, is connected to and between the inverting input 16 and the amplifier output 20.

The balance circuit of the present invention is believed to be shown in its simpliest possible form in FIG. 1. The balance circuit 12 is made up of an adjustable voltage means $E_{b1}$ (shown diagrammatically) connected in series with resistor $R_{b1}$ to the inverting input 16, and an adjustable voltage means $E_{b2}$ connected in series with resistor $R_{b2}$ to the non-inverting input 22 of the amplifier 14. The adjustable voltage means $E_{b1}$ and $E_{b2}$ should comprise voltage sources which are able to provide voltages having magnitudes which can be accurately varied in the range of a few millivolts.

In order to facilitate a mathematical description of the method and balance circuit for achieving a stable offset voltage balance, the operational amplifier input bias current entering the inverting input 16 is designed $i_{b1}$, and the voltage at the inverting input is designated $e_1$. The input bias current entering the non-inverting input 22 is designated $i_{b2}$, and the voltage at the non-inverting input is designated $e_2$. The magnitudes of the voltages $e_1$ and $e_2$ are in the range of millivolts, and the magnitudes of the bias currents $i_{b1}$ and $i_{b2}$ are in the range of nanoamperes. A voltage signal is fed to the inverting input 16 by any suitable variable voltage source, designated $V_s$, and the output voltage of the operational amplifier is designated $V_o$.

With the voltage $V_s$ set equal to a reference level, which is preferable zero volts, the method of the present invention for balancing the offset voltage preferably comprises the steps of applying the first adjustable voltage $E_{b1}$ to the inverting input to set the inverting input voltage $e_1$ equal to zero, and applying the second adjustable voltage $E_{b2}$ to the non-inverting input to set the amplifier output voltage $V_o$ to zero. The following description and mathematical equations demonstrate that the resulting offset voltage balance is generally insensitive to changes in values of the input resistor and the feedback resistor.

More specifically, the adjustment of the balance circuit requires the following:

With $V_s=0$, adjust $E_{b1}$ such that $$E_{b1} - R_{b1}i_{b1} = 0. \tag{1}$$

Then $e_1 = 0$, when $V_s = 0$.
With $V_s=0$, adjust $E_{b2}$ such that $$E_{b2} - R_{b2}i_{b2} \pm e_o = 0 \tag{2}$$

where $\pm e_o$ is the offset voltage existing after adjustment of $E_{b1}$. The offset voltage $\pm e_o$ is defined to be the input voltage difference at the amplifier inputs at which the amplifier output voltage is zero.

If $V_s$ is not zero, then $$V_o = -\frac{R_f}{R_i} V_s + (E_{b2} - R_{b2}i_{b2} \pm e_o)(1 + \frac{R_f}{R_p}) - (E_{b1} - R_{b1}i_{b1})\frac{R_f}{R_{b1}} \tag{3}$$

where $\frac{1}{R_p} = \frac{1}{R_{b1}} + \frac{1}{R_i}$, or $V_o = -\frac{R_f}{R_i} V_s$ (4)

assuming the conditions of equations (1) and (2).

Inspection of equations (3) and (4) shows that a change in $R_f$ and $R_i$ will not alter the offset voltage balance if the balance circuit is adjusted properly, i.e., if the balance circuit has been adjusted so that the terms in equations 1 and 2, $(E_{b2}=R_{b2}i_{b2}\pm e_o)$ and $(E_{b1}-R_{b1}i_{b1})$, are equal to zero.

Figure 2:
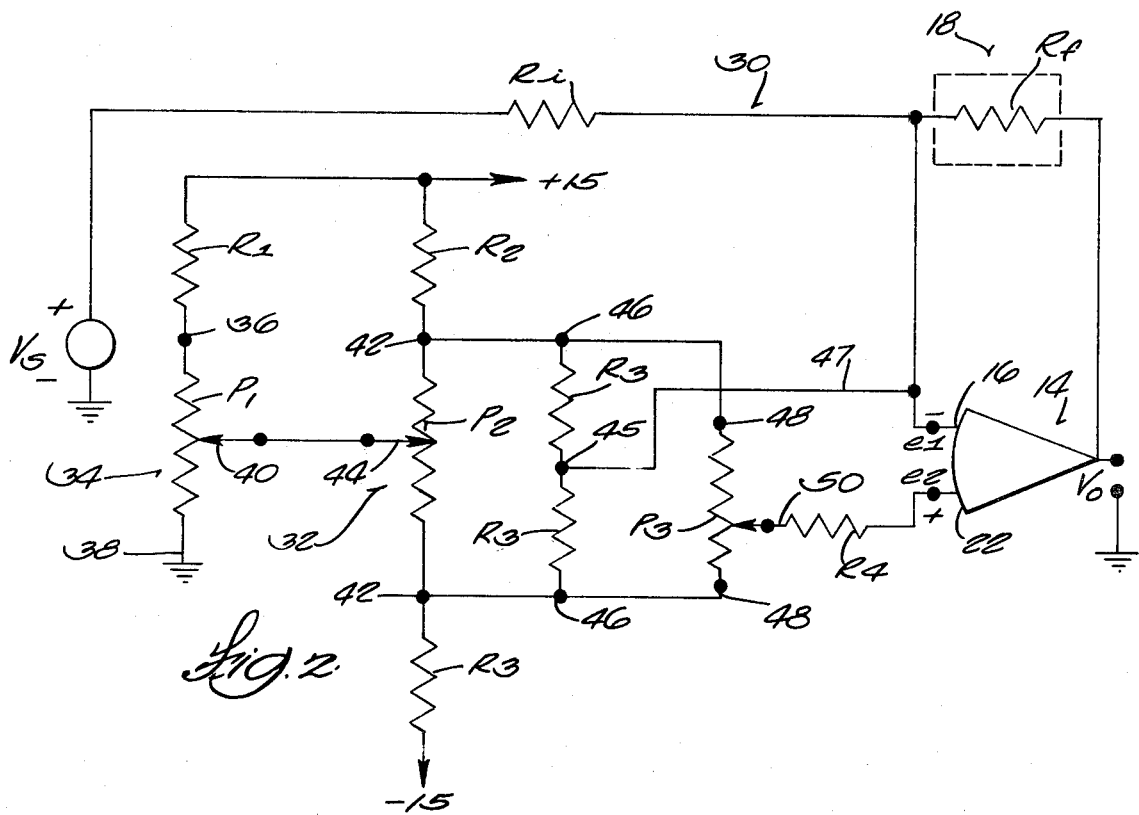
FIG. 2 is a schematic diagram of a preferred embodiment of an amplifier circuit which embodies various features of the invention.

Turning to the amplifier circuit 30 shown in FIG. 2, a balance circuit which comprises a variable or adjustable voltage divider network, generally designated 32, is utilized to exemplify the preferred embodiment of the present invention. The components of the amplifier circuit 30 which are the same as the components of the amplifier circuit 10 shown in FIG. 1 are designated by the same reference characters. The operational amplifier 14 is powered by conventional positive and negative power supplies designated +15 and −15 (volts) respectively. The specific connections of the power supplies to the operational amplifier are not shown.

The balance circuit or variable voltage divider network 32 includes means for applying a first adjustable voltage to the inverting input 16 for setting the inverting input voltage to zero, and means for applying a second adjustable voltage to the non-inverting input 22 for setting the amplifier output voltage $V_o$ to zero. The resulting offset voltage balance is generally insensitive to changes in the resistance or impedance values of the input resistor $R_i$ and the feedback means 18, or feedback resistor $R_f$.

More particularly, the first adjustable voltage means comprises a "coarse" potentiometer 34 (diagramatically shown) having opposite end terminals 36 and 38, one of which is connected to ground, and having an adjustable wiper 40. A first resistor $R_1$ is connectd to and between the first potentiometer end terminal 36 and one of the power supplies, preferrable the positive power supply +15, as shown. The first adjustable voltage means also includes a "fine" potentiometer $P_2$ having opposite end terminals 42, and an adjustable wiper 44 connected to the adjustable wiper 40 of the course potentiometer $P_1$.

A pair of second resistors $R_2$, are each respectively connected to and between one of the second potentiometer end terminals 42 and one of the power supplies. As illustrated in FIG. 2, a pair of third resistors $R_3$ are connected in the network 32 so that each resistor has one end 45 commonly connected by line 47 to the inverting input 16, and has an opposite end 46 connected to one of the second potentiometer end terminals 42.

The second adjustable voltage means included in the balance circuit or network 32 comprises a third potentiometer $P_3$ having opposite end terminals 48 each respectively connected to one of the end terminals 42 of the potentiometer $P_2$, and a fourth resistor $R_4$ connected to and between the third potentiometer adjustable wiper 50 and the non-inverting input 22 of the operational amplifier 14.

As shown, the potentiometers $P_1$ and $P_2$ are connected in the balance circuit or network 32 to respectively provide coarse and fine adjustments of both of the absolute voltage levels at the inverting and non-inverting inputs 16 and 22, respectively. The potentiometer $P_3$ provides an adjustment of the relative value of these absolute voltage levels by allowing for an additional separate adjustment of the voltage level at the non-inverting input 22.

In order to facilitate a mathematical description of the appropriate relative resistance values of the potentiometers and resistors utilized in the balance circuit or network 32, the magnitude of the voltage of the amplifier power supplies is designed E, and the absolute offset voltage of the amplifier before any compensating voltage is applied to the inputs is designated $e_o$. To achieve a stable offset voltage balance, the maximum resistance values for the potentiometers, and the resistance values for the resistors are selected so that the following conditions are satisfied:

1. $\frac{P_2}{R_2}$ is greater than $\left(\frac{\text{maximum } e_o}{E}\right)$;

2. $\frac{P_1}{R_1}$ is greater than $\frac{(\text{maximum } i_b)(R_b)}{E}$; and 3. $P_2$ is much less than $P_3$ is much less than $R_4$ where $R_3 = 2R_4$.

3. $P_2$ is much less than $P_3$ is much less than $R_4$ where $R_3 = 2R_4$.

The value of $R_4$ must be selected as indicated by equation (3) as a compromise considering several effects. If $R_4$ is small compared to typical values of $R_i$ and $R_f$, then a thermally induced change in input current will not significantly alter the bias or offset balance (assuming $i_{b1}$ is approximately equal to $i_{b2}$). However, a decrease in $R_4$ will increase the output offset for a given magnitude of balance misadjustment or change in amplifier offset voltage. Preferred values for the various resistances of the potentiometers and resistors of network 32 are as follows: $P_1 = 100$ ohms, $P_2 = 20$ ohms, $P_3 = 1K$ ohm, $R_1$ and $R_2 = 50K$ ohms, $R_3 = 1$ Megohm and $R_4 = 500K$ ohms.

The preferred method or adjustment of the balance circuit or network 32 to balance the amplifier offset voltage, and to provide a balance generally insensitive to changes in the resistance values of the input resistor and feedback resistor is set forth below. Prior to the actual adjustments, potentiometers $P_2$ and $P_3$ are moved to the center of their range, and as was described with the circuit 10 in FIG. 1, $V_s$ is set equal to zero.

The method of achieving the stable offset balance includes the step of applying a first adjustable voltage to the inverting input 16 to set the voltage $e_1$ of the inverting input to zero. More particularly, in order to set the inverting input voltage $e_1$ equal to zero the following steps occur. A first value for the input resistor $R_i$ is chosen; preferably $R_i$ is set equal to infinity, and the value of the output voltage $V_o$ is noted or measured for later reference. The value of $V_o$ will most probably be non-zero and in the range of up to a few hundred millivolts. During measurement of $V_o$, the feedback resistor is preferably set at 10 megohms. $V_o$ can be measured using an oscilloscope while a 0.1 microfarad capacitor is connected in parallel across the feedback resistor to prevent noise from influencing the measurement. After $V_o$ is measured, the input resistor is then set or chosen to have a second value substantially different from the first value; the second value of $R_i$ is preferably 100K ohms, and potentiometer $P_1$ is adjusted until the output voltage $V_o$ of the amplifier is the same as it was when the input resistance was set equal to the first value or infinity. At this point, the inverting input voltage, $e_1$, should be set equal to zero.

The method also includes the step of applying a second adjustable voltage to the non-inverting input for setting the amplifier output voltage equal to zero. More particularly, after potentiometer $P_1$ has been adjusted as described, and with $R_i$ remaining at the second value or 100K ohms, and with $V_s$ remaining at zero, potentiometer $P_3$ is adjusted until the output voltage $V_o$ is zero. At this point, a reasonably good offset voltage balance has been achieved.

In order to provide an even more accurate offset voltage balance the above two steps are repeated, substituting adjustment of the fine potentiometer $P_2$ for the adjustment of the coarse potentiometer $P_1$. This fine adjustment is recommended since the adjustment of potentiometers $P_1$ and $P_3$ are not completely independent. Accordingly, the final steps are to note the output voltage $V_o$ with the input resistance $R_i$ set at the first value or infinity; $R_i$ is then chosen or set to the second value or 100 kohms, and the fine potentiometer $P_2$ is adjusted so the output voltage $V_o$ is the same as when the input resistor was set at the first value. The potentiometer $P_3$ is then readjusted, if necessary, so that the output voltage $V_o$ of the amplifier is again equal to zero.

In terms of comparing the adjustment of the simplified balance circuit 10 shown in FIG. 1 and the adjustment of balance circuit 30 shown in FIG. 2, the adjustment of the coarse or fine potentiometers $P_1$ and $P_2$ is analogous to adjusting the variable voltages $E_{b1}$ and $E_{b2}$ together until the value of the voltage $e_i$ at the inverting input is zero. Adjustment of the potentiometer $P_3$ is analogous to adjusting the second variable voltage $E_{b2}$ until the amplifier output $V_o$ is zero.

It should be noted that as a practical matter, a "generally insensitive" offset voltage balance can be obtained for the input resistor $R_i$ having a resistance value within a range of 100K ohms to infinity, and the feedback resistor $R_f$ having a resistance value within a range from zero to 10 megohms. It should be realized that an absolutely "perfect" balance is never obtained, but these resistance value ranges are limits for which a "reasonable good" balance can be easily obtained.

The dual-adjustment balance circuit 30 shown in FIG. 2 is particularly adapted for use with inverting operational amplifiers used in analog computation or analog computers. Such analog computers have plug-in or interchangable components or resistors wherein different value input resistors and feedback resistors are frequently and readily substituted.

Figure 3:
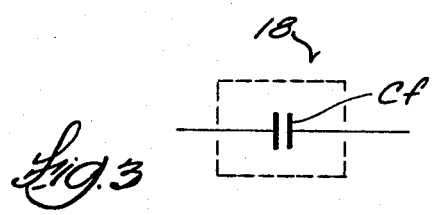
FIG. 3 is a schematic view of a feedback capacitor which can be substituted for the feedback resistor shown in the circuit of FIG. 1 or FIG. 2.

While the feedback means, generally designated 18, has been described as a feedback resistor, other electrical elements could be utilized. In particular, the operational amplifier 14 can be utilized as an integrator by substituting a capacitor $C_f$ (see FIG. 3) for the feedback means or feedback resistor $R_f$. Capacitors having values ranging from 0.01 to 1 microfarads have been used successfully without upsetting the offset voltage balance. The desirable characteristic of the balance circuit 30 is very prominently exhibited with an integrator circuit because failure to achieve and maintain an offset voltage balance produce a constantly increasing error, rather than a constant error.

It is to be understood the invention is not confined to the particular method and construction and arrangement of parts as herein illustrated and described, but embraces all such modified forms thereof as come within the scope of the following claims.

I claim:

1. A dual-adjustment balance circuit for an operational amplifier having an inverting input and a non-inverting input, the amplifier having an input resistor connected to the inverting input, and a feedback resistor connected to and between the inverting input and the amplifier output, said balance circuit comprising:

means for applying a first adjustable voltage to the inverting input for setting the inverting input voltage to zero, and means for applying a second adjustable voltage to the non-inverting input for setting the amplifier output voltage to zero so as to provide an offset voltage balance that is generally insensitive to changes in values of the input resistor and the feedback resistor.

2. A dual-adjustment balance circuit as specified in claim 1
wherein the operational amplifier includes positive and negative power supplies,
wherein said first adjustable voltage means is connected to the positive and negative power supplies and to the inverting input for applying said first adjustable voltage to the inverting input, and
wherein said second adjustable voltage means is connected to said first adjustable voltage means and to said non-inverting input for applying said second adjustable voltage to the non-inverting input.

3. A dual-adjustment balance circuit as specified in claim 1
wherein the operational amplifier includes positive and negative power supplies,
wherein said first adjustable voltage means comprises
a first potentiometer having opposite end terminals and a first adjustable wiper,
a first resistor connected to and between one of said first potentiometer end terminals and one of the power supplies,
a second potentiometer having opposite end terminals and a second adjustable wiper connected to said first adjustable wiper of said first potentiometer,
a pair of second resistors each respectively connected to and between one of said second potentiometer end terminals and one of the power supplies, and
a pair of third resistors each having one end commonly connected to the inverting input of the operational amplifier, and each having an opposite end respectively connected to one of said second potentiometer end termianls, and
wherein said second adjustable voltage means comprises
a third potentiometer having opposite end terminals each respectively connected to one of said second potentiometer end terminals, and having a third adjustable wiper, and
a fourth resistor connected to and between said third adjustable wiper and the non-inverting input of the operational amplifier.

4. A dual-adjustment balance circuit as specified in claim 3
wherein the power supplies have a maximum voltage value E,
wherein said operational amplifier has an absolute offset voltage $e_o$, and an input bias current $i_b$,
wherein said first potentiometer has a maximum resistance value $P_1$, said second potentiometer has a maximum resistance value $P_2$, and said third potentiometer has a maximum resistance value $P_3$,
wherein said first resistor has a resistance value $R_1$, said second resistors each generally have a resistance value $R_2$, said third resistors each generally have a resistance value $R_3$, and said fourth resistor has a resistance value $R_4$, and
wherein the magnitude of the resistance values of said potentiometers and said resistors are such that:

$\frac{P_2}{R_2}$ is greater than $(\frac{\text{maximum } e_o}{E})$;

$\frac{P_1}{R_1}$ is greater than $\frac{(\text{maximum } i_b)(R_4)}{E}$; and $P_2$ is much less than $P_3$ is much less than $R_4$ where $R_3 = 2R_4$.

5. A dual-adjustment balance circuit as specified in claim 4 wherein the resistance values of said potentiometers and said resistors are generally equal to the following: $P_1$ (100 ohms); $P_2$ (20 ohms); $P_3$ (1K ohm); $R_1$ (50K ohms); $R_2$ (50 K ohms); $R_3$ (1 megohm); and $R_4$ (500K ohms).

6. An amplifier circuit suitable for use in analog computation comprising:
an operational amplifier having an inverting input, a non-inverting input, and an output,
an input resistor connected to said inverting input,
feedback means connected to and between said non-inverting input and said amplifier output,
means for applying a first adjustable voltage to said inverting input for setting the inverting input voltage to zero, and
means for applying a second adjustable voltage to said non-inverting input for setting the amplifier output voltage to zero so as to provide an offset voltage balance for said operational amplifier that is generally insensitive to changes in impedance values of said input resistor and said feedback means.

7. An amplifier circuit as specified in claim 6 wherein said feedback means comprises a capacitor so that said operational amplifier operates as integrator.

8. An amplifier circuit as specified in claim 7
wherein said capacitor has a capacitance value within a range varying from 0.01 microfarads to 1 microfarad, and
wherein said offset voltage balance is generally insensitive to change in the impedance value of said capacitor having a capacitance within said range.

9. An amplifier circuit as specified in claim 6
wherein said input resistor has a resistance value within a first range varying from 100K ohms to infinity,
wherein said feedback means comprises a feedback resistor having a resistance value within a second range varying from 0 to 10 megohms, and
wherein said offset voltage balance is generally linsensitive to changes in the resistance value of said input resistor within said first range, and to changes in the resistance value of said feedback resistor within said second range.

10. An amplifier circuit as specified in claim 6
wherein said operational amplifier is adapted to be powered by positive and negative power suppliers,
wherein said first adjustable voltage means comprises
a first potentiometer having opposite end terminals and a first adjustable wiper,
a first resistor connected to and between one of said first potentiometer end terminals and one of the power supplies,
a second potentiometer having opposite end terminals and a second adjustable wiper connected to said first adjustable wiper of said first potentiometer, a pair of second resistors each respectively connected to and between one of said second potentiometer end terminals and one of the power supplies, and a pair of third resistors each having one end commonly connected to said inverting input of said operational amplifier, and each having an opposite end respectively connected to one of said second potentiometer end terminals, and wherein said second adjustable voltage means comprises a third potentiometer having opposite end terminals each respectively connected to one of said second potentiometer end terminals, and having a third adjustable wiper, and a fourth resistor connected to and between said third adjustable wiper and said non-inverting input of said operational amplifier.

11. An amplifier circuit as specified in claim 10 wherein the power supplies have a maximum voltage value E, wherein said operational amplifier has an absolute offset voltage $e_o$, and an input bias current $i_b$, wherein said first potentiometer has a maximum resistance value $P_1$, said second potentiometer has a maximum resistance value $P_2$, and said third potentiometer has a maximum resistance value $P_3$, wherein said first resistor has a resistance value $R_1$, said second resistors each generally have a resistance value $R_2$, said third resistors each generally have a resistance value $R_3$, and said fourth resistor has a resistance value $R_4$, and wherein the magnitude of the resistance values of said potentiometers and said resistors are such that:

$\frac{P_2}{R_2}$ is greater than ($\frac{\text{maximum } e_o}{E}$);

$\frac{P_1}{R_1}$ is greater than $\frac{(\text{maximum } i_b)(R_4)}{E}$; and $P_2$ is much less than $P_3$ is much less than $R_4$ where $R_3 = 2R_4$.

12. An amplifier circuit as specified in claim 11 wherein the resistance values of said potentiometers and said resistors are generally equal to the following: $P_1$ (100 ohms); $P_2$ (20 ohms); $P_3$ (1K ohm); $R_1$ (50K ohms); $R_2$ (50K ohms); $R_3$ (1 megohm); and $R_4$ (500K ohms).

13. A method of balancing the offset voltage of an operational amplifier having an inverting input connected to a variable signal voltage set equal to zero, and having a non-inverting input, the amplifier also having an input resistor connected to the inverting input, and a feedback resistor connected to and between the inverting input and the amplifier output, said method comprising the steps of:

applying a first adjustable voltage to the inverting input to set the inverting input voltage to zero, and applying a second adjustable voltage to the non-inverting input to set the amplifier output votage to zero, whereby an offset voltage balance is provided that is generally insensitive to changes in values of the input resistor and the feedback resistor.

14. A method of balancing the offset voltage as specified in claim 13 wherein said step of applying a first adjustable voltage comprises setting and changing the resistance value of the input resistor from a first value to a substantially different second value, and adjusting the first adjustable voltage until the amplifier output voltage is the same as it was when the input resistor was set at said first value.

15. A method of balancing the offset voltage as specified in claim 14 where said setting and changing the resistance value of said input resistor comprises setting said input resistor resistance value generally equal to infinity, measuring the amplifier output voltage, and changing said input resistor resistance value so as to be set generally equal to 100K ohms.

16. A method of balancing the offset voltage as specified in claim 14 wherein said adjustment of said first adjustable voltage comprises adjusting a coarse potentiometer, and wherein said method further comprises repeating the steps of applying said first adjustable voltage and applying said second adjustable voltage, said repeated steps substituting adjustment of a fine potentiometer for adjustment of the coarse potentiometer.

* * * * *